(12) United States Patent
Xiong et al.

(10) Patent No.: US 12,022,605 B2
(45) Date of Patent: Jun. 25, 2024

(54) STACKING SYSTEM

(71) Applicant: Delta Electronics, Inc., Taoyuan (TW)

(72) Inventors: Yahong Xiong, Taoyuan (TW);
Xiaodong Chen, Taoyuan (TW); Wei Liu, Taoyuan (TW); Litao Qian, Taoyuan (TW); Shengli Lu, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 220 days.

(21) Appl. No.: 17/856,808

(22) Filed: Jul. 1, 2022

(65) Prior Publication Data
US 2023/0009017 A1    Jan. 12, 2023

(30) Foreign Application Priority Data

Jul. 12, 2021 (CN) .......................... 202110785573.X

(51) Int. Cl.
*H05K 7/20*     (2006.01)
*H05K 1/02*     (2006.01)

(52) U.S. Cl.
CPC ....... *H05K 1/0203* (2013.01); *H05K 7/20254* (2013.01); *H05K 7/2039* (2013.01); *H05K 2201/064* (2013.01); *H05K 2201/066* (2013.01)

(58) Field of Classification Search
CPC ............. H05K 1/0201; H05K 7/20163; H05K 7/2039; G06F 1/203
See application file for complete search history.

(56) References Cited

U.S. PATENT DOCUMENTS

| | | | | |
|---|---|---|---|---|
| 3,904,934 A | * | 9/1975 | Martin ................. | H01R 12/714 361/776 |
| 4,628,407 A | * | 12/1986 | August ................ | H05K 1/0206 257/E23.101 |
| 4,924,352 A | * | 5/1990 | Septfons ................ | H05K 3/341 257/E23.101 |
| 5,083,194 A | * | 1/1992 | Bartilson ............ | H01L 23/3677 257/722 |
| 5,095,404 A | * | 3/1992 | Chao ..................... | H01L 23/427 361/783 |
| 5,159,529 A | * | 10/1992 | Lovgren ............ | H05K 7/20254 361/689 |

(Continued)

FOREIGN PATENT DOCUMENTS

CN        211857412 U     11/2020

*Primary Examiner* — Adrian S Wilson
(74) *Attorney, Agent, or Firm* — KIRTON McCONKIE; Evan R. Witt

(57) ABSTRACT

A stacking system is disclosed and includes a circuit board, an integrated circuit, a voltage regulation module and a heat dissipation module. The integrated circuit and the voltage regulation module are opposite disposed on a first side and a second side of the circuit board. The heat dissipation module includes a first heat dissipation component and a second heat dissipation component located at a top surface of the integrated circuit and the bottom surface of the voltage regulation module. The second heat dissipation component includes a base and an extended arm. The base is in thermal contact with bottom surface of the voltage regulation module. The extended arm is extended from the base to the first heat dissipation component and in thermal contact with the first heat dissipation component.

20 Claims, 15 Drawing Sheets

(56) References Cited

U.S. PATENT DOCUMENTS

| | | | | |
|---|---|---|---|---|
| 5,166,775 A | * | 11/1992 | Bartilson | H01L 23/3677 |
| | | | | 257/E23.105 |
| 5,287,247 A | * | 2/1994 | Smits | H01L 23/36 |
| | | | | 257/E23.101 |
| 5,694,297 A | * | 12/1997 | Smith | H01L 23/467 |
| | | | | 257/E23.099 |
| 5,812,375 A | * | 9/1998 | Casperson | H05K 1/0204 |
| | | | | 361/720 |
| 5,986,887 A | * | 11/1999 | Smith | H05K 7/20509 |
| | | | | 174/16.3 |
| 7,145,231 B2 | * | 12/2006 | Hasebe | H05K 1/0206 |
| | | | | 361/720 |
| 7,272,001 B2 | * | 9/2007 | Cheng | G06F 1/20 |
| | | | | 174/547 |
| 7,499,281 B2 | * | 3/2009 | Harris | H05K 1/141 |
| | | | | 165/185 |
| 8,018,738 B2 | * | 9/2011 | Doblar | H05K 1/0262 |
| | | | | 257/713 |
| 8,498,117 B2 | | 7/2013 | Andric et al. | |
| 11,004,783 B2 | | 5/2021 | Calugaru | |
| 2008/0002382 A1 | * | 1/2008 | Howell | H05K 1/141 |
| | | | | 361/803 |

\* cited by examiner

STACKING SYSTEM

CROSS-REFERENCE TO RELATED APPLICATION

This application claims priority to China Patent Application No. 202110785573.X, filed on Jul. 12, 2021. The entire contents of the above-mentioned patent application are incorporated herein by reference for all purposes.

FIELD OF THE INVENTION

The present disclosure relates to a technology field of power electronic devices, and more particularly to a stacking system including a heat dissipation structure matched with a vertical power supply for improving the heat dissipation efficiency of a voltage regulation module in the stacking system with a limited space, simplifying the assembling and manufacturing process and reducing the cost at the same time.

BACKGROUND OF THE INVENTION

As an essential part of power conversion, modern power electronic devices are wildly used in power, electronic, electrical machinery and energy industries. With the development of power electronics technology, higher requirements are put forward for the power level, the power density and the modularity of the high-power switching power supply. Furthermore, the modular layout of high-power switching power supply needs to consider the requirements of high power density and heat dissipation efficiency.

With the developments of data center, artificial intelligence and semiconductor technology, the power supply current of integrated circuits such as GPU/CPU/ASIC is increased, and reaches more than 1000 A. In a conventional horizontal power supply, the voltage regulation module and the integrated circuit are arranged on the same side of the circuit board. Since long distance is formed between the voltage regulation module and the integrated circuit, and the directive current resistance (DCR) generated therefrom reaches more than 100 μΩ, and the impact on the power supply efficiency also reaches more than 10%, so that the configuration structure of the horizontal power supply fails to meet the requirements of application performance. On the other hand, in a vertical power supply, the voltage regulation module and the integrated circuit are arranged on the opposite sides of the circuit board, respectively, and the distance between the voltage regulation module and the integrated circuit decreases, so as to reduce the generated DCR and improve the power supply efficiency. However, since the voltage regulation module and the integrated circuit are arranged on opposite sides, respectively, the circuit board where the integrated circuit is disposed has limited the space for the voltage regulation module to dispose an independent heat dissipation device that meets its heat dissipation requirements. Especially, in case of that the available height of the bottom side of the circuit board where the integrated circuit is disposed is limited, it is easy to make the voltage regulation module become the bottleneck of heat dissipation. For example, the circuit board with the integrated circuit disposed thereon is configured to install on the system motherboard through a socket, and the integrated circuit and the voltage regulation module are arranged on the top side and the bottom side of the circuit board, respectively. Due to the height limitation of the socket disposed on the bottom side of the circuit board, the height between the circuit board and the system motherboard is not enough for the voltage regulation module to install the heat dissipation device thereon.

Therefore, there is a need to provide a stacking system including a heat dissipation structure matched with a vertical power supply for improving the heat dissipation efficiency of a voltage regulation module in the stacking system with a limited space, simplifying the assembling and manufacturing process and reducing the cost at the same time, so as to address the above issues encountered by the prior arts.

SUMMARY OF THE INVENTION

An object of the present disclosure is to provide a stacking system including a heat dissipation structure matched with a vertical power supply for improving the heat dissipation efficiency of a voltage regulation module in the stacking system with a limited space, simplifying the assembling and manufacturing process and reducing the cost at the same time. In the stacking system for a vertical power supply, the voltage regulation module and the integrated circuit are arranged on two opposite sides of the circuit board. The heat dissipation module includes two heat dissipation components, which are in thermal contact with the top surface of the integrated circuit and the bottom surface of the voltage regulation module respectively, so as to form a vertical stacking structure. On the other hand, the two heat dissipation components are in contact with each other through an extension arm extended from one of the heat dissipation components, so as to improve the heat dissipation efficiency of the stacked system. Furthermore, the two heat dissipation components of the heat dissipation module are fastened and connected to the circuit board by fastening components such as spring screws, respectively. When the combination structure that is vertically stacked is formed, the two heat dissipation components are connected and effectively attached to the top surface of the integrated circuit and the bottom surface of the voltage regulation module, respectively. Moreover, a thermal interface material layer is provided between the heat dissipation module and the integrated circuit, and between the heat dissipation module and the voltage regulation module, so as to further enhance the heat dissipation performance.

Another object of the present disclosure is to provide a stacking system. Since the stacking system is correspondingly connected to a system motherboard through a plug-in portion thereof, the space between the voltage regulation module and the system motherboard is limited. With the combination structure stacked vertically, the heat dissipation problem of the heat dissipation module is solved effectively. The fastening component configured to fix the heat dissipation module is allowed to fix the stacking system on the system motherboard at the same time, so as to simplify the assembling process of the heat dissipation module, reduce the cost of the heat dissipation module, and improve the competitiveness of the product. In addition, in the application of the voltage regulation module combined with the bus voltage converter, the combination distance between the stacking system and the system motherboard is reduced, the vertical stacking structure of the stacking system can avoid the interference between the heat dissipation module and the system motherboard in the vertical direction through an accommodation opening of the system motherboard, and the overall height of the stacking system and the system motherboard is further reduced after assembly. The heat dissipation problem caused in the limited space is solved effectively.

In accordance with an aspect of the present disclosure, a stacking system is provided and includes a circuit board, an integrated circuit, a voltage regulation module and a heat dissipation module. The circuit board includes a first side and a second side opposite to each other. The integrated circuit is disposed on the first side of the circuit board. The voltage regulation module is disposed on the second side of the circuit board and spatially corresponding to the integrated circuit. The heat dissipation module includes a first heat dissipation component and a second heat dissipation component. The first heat dissipation component is located at a top surface of the integrated circuit and in thermal contact with the top surface of the integrated circuit, the second heat dissipation component includes a base and at least one extended arm, the base is located at a bottom surface of the voltage regulation module and in thermal contact with the bottom surface of the voltage regulation module, and the at least one extended arm is extended from the base along a direction from the voltage regulation module toward the circuit board and in thermal contact with the first heat dissipation component.

BRIEF DESCRIPTION OF THE DRAWINGS

The above contents of the present disclosure will become more readily apparent to those ordinarily skilled in the art after reviewing the following detailed description and accompanying drawings, in which.

DETAILED DESCRIPTION OF THE PREFERRED EMBODIMENT

Figure 1:
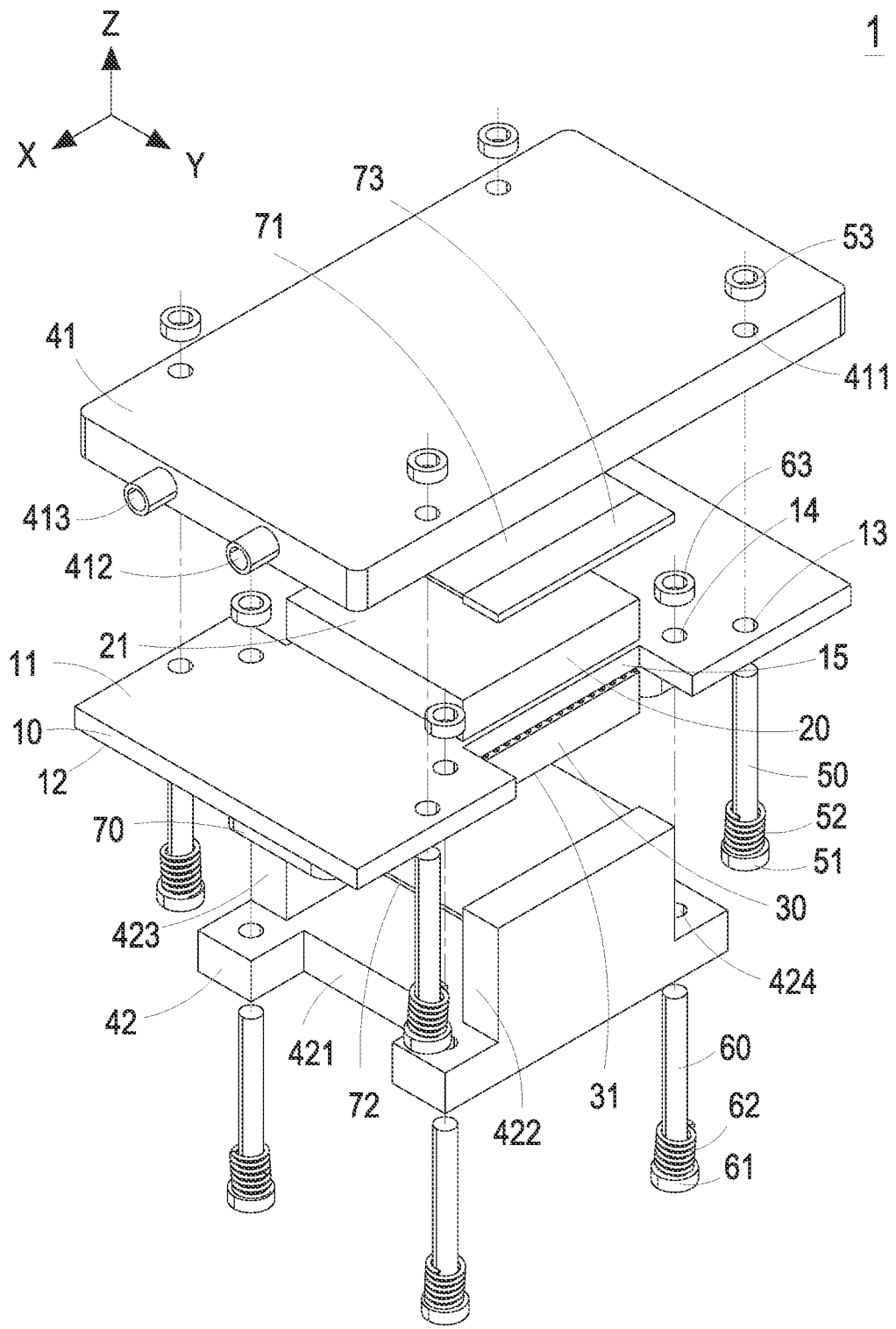
FIG. 1 is an exploded view illustrating a stacking system according to a first embodiment of the present disclosure.

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. When an element is referred to as being "connected," or "coupled," to another element, it can be directly connected or coupled to the other element or intervening elements may be present. Although the wide numerical ranges and parameters of the present disclosure are approximations, numerical values are set forth in the specific examples as precisely as possible. In addition, although the "first," "second," "third," and the like terms in the claims be used to describe the various elements can be appreciated, these elements should not be limited by these terms, and these elements are described in the respective embodiments are used to express the different reference numerals, these terms are only used to distinguish one element from another element. For example, a first element could be termed a second element, and, similarly, a second element could be termed a first element, without departing from the scope of example embodiments. Besides, "and/or" and the like may be used herein for including any or all combinations of one or more of the associated listed items. Alternatively, the word "about" means within an acceptable standard error of ordinary skill in the art-recognized average. In addition to the operation/working examples, or unless otherwise specifically stated otherwise, in all cases, all of the numerical ranges, amounts, values and percentages, such as the number for the herein disclosed materials, time duration, temperature, operating conditions, the ratio of the amount, and the like, should be understood as the word "about" decorator. Accordingly, unless otherwise indicated, the numerical parameters of the present invention and scope of the appended patent proposed is to follow changes in the desired approximations. At least, the number of significant digits for each numerical parameter should at least be reported and explained by conventional rounding technique is applied. Herein, it can be expressed as a range between from one endpoint to the other or both endpoints. Unless otherwise specified, all ranges disclosed herein are inclusive.

Figure 2:
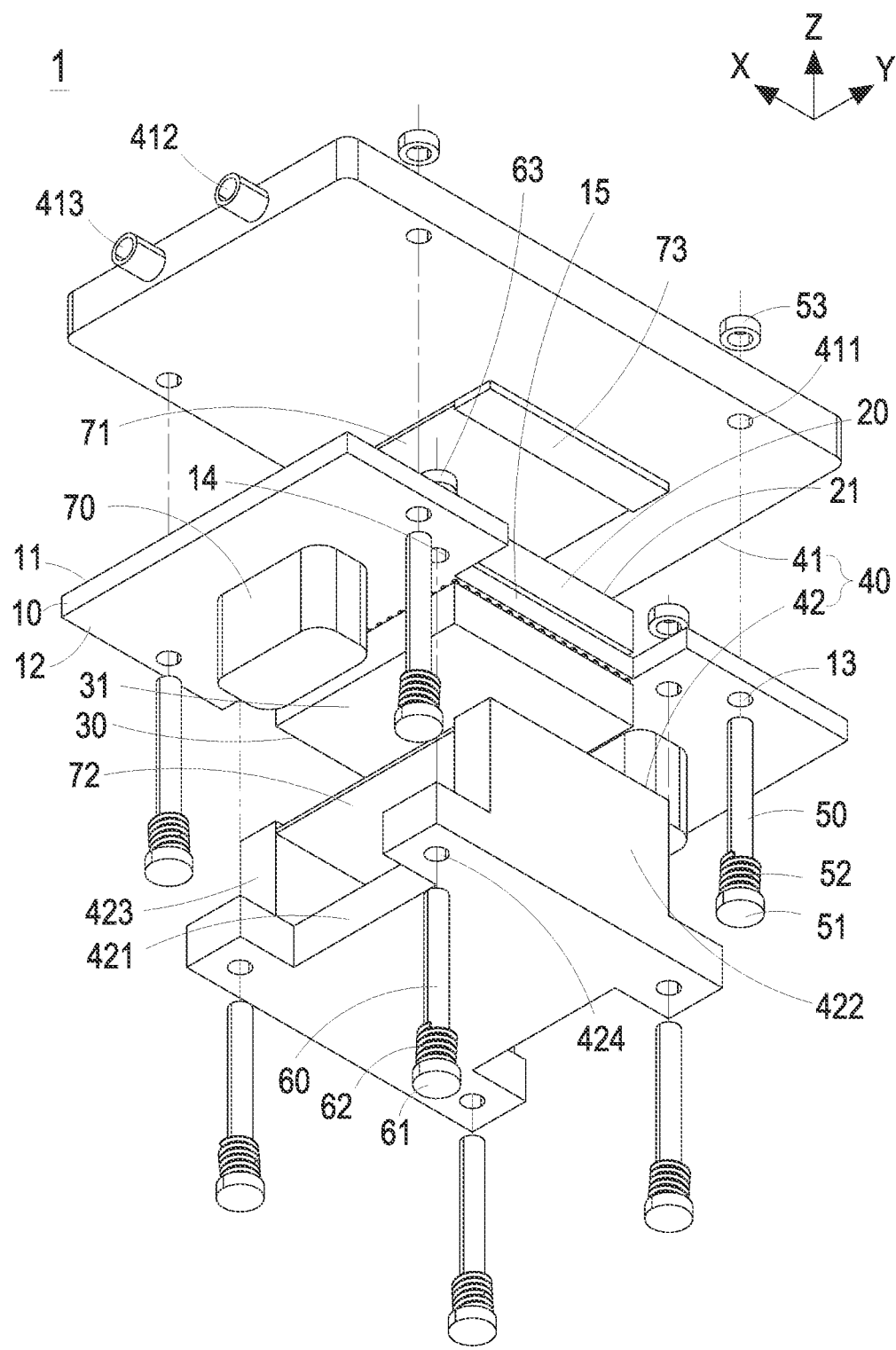
FIG. 2 is an exploded view illustrating the stacking system according to the first embodiment of the present disclosure and taken from another perspective.
Figure 3:
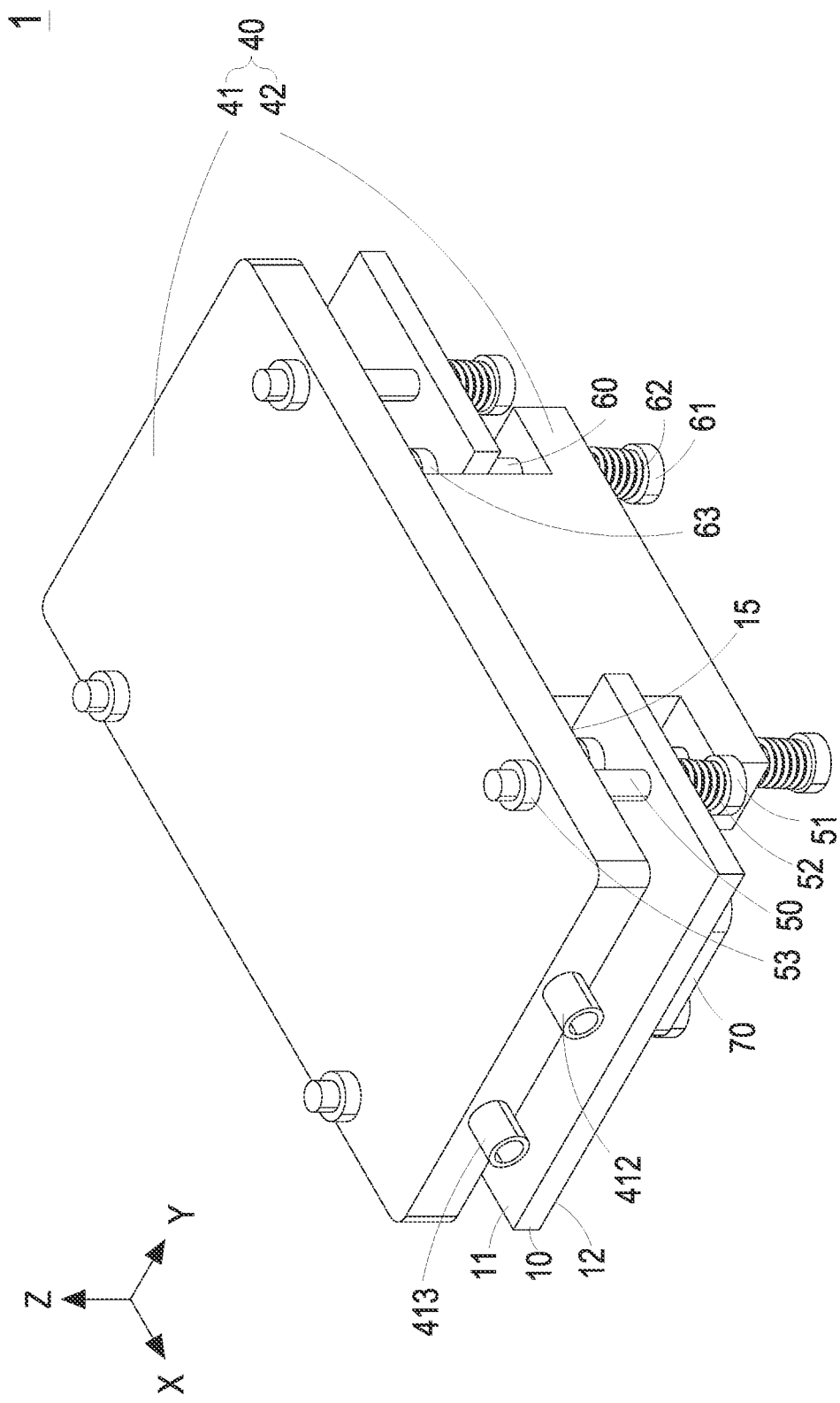
FIG. 3 is a schematic structural view illustrating the stacking system according to the first embodiment of the present disclosure.
Figure 4:
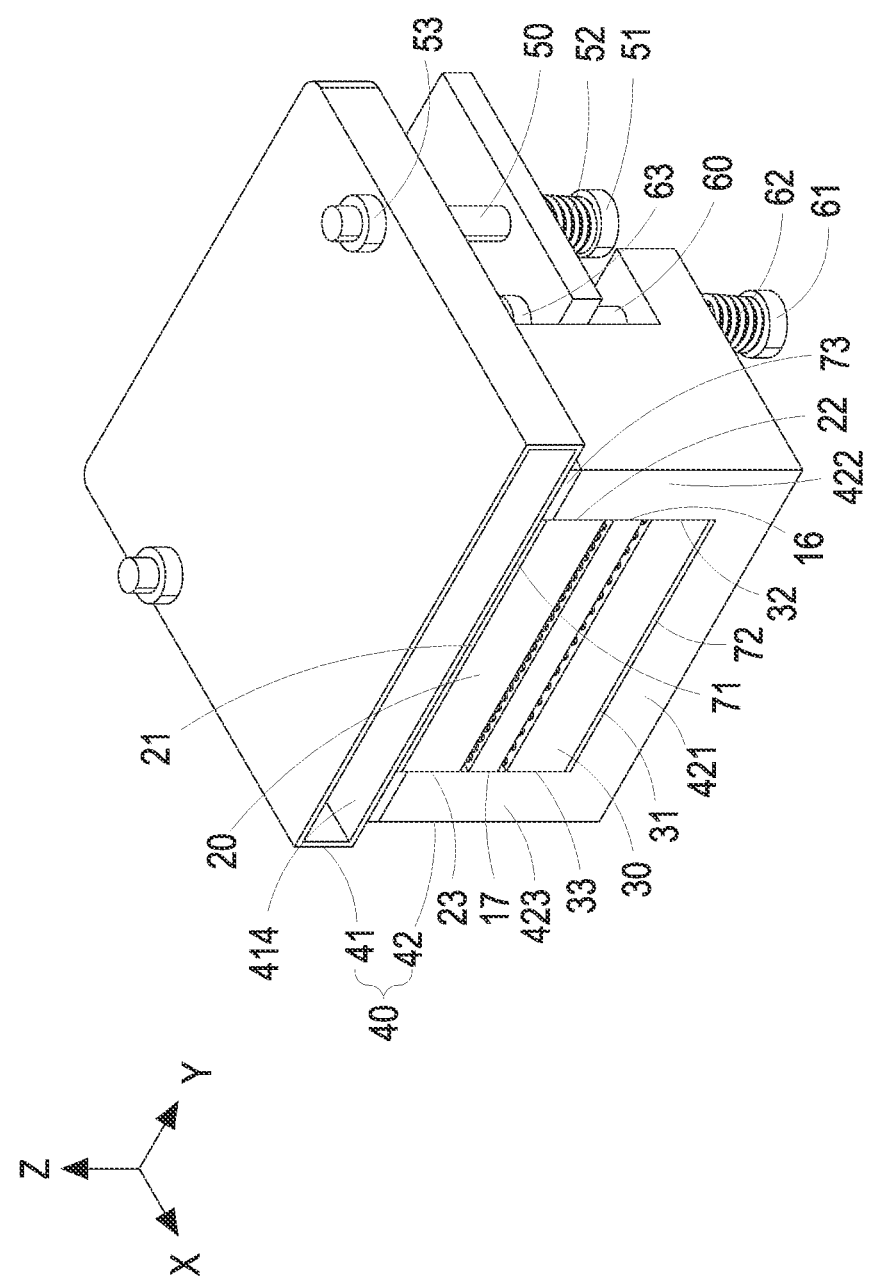
FIG. 4 is a schematic cross-sectional view illustrating the stacking system according to the first embodiment of the present disclosure.

FIG. 1 and FIG. 2 are exploded views illustrating a stacking system according to a first embodiment of the present disclosure. FIG. 3 is a schematic structural view illustrating the stacking system according to the first embodiment of the present disclosure. FIG. 4 is a schematic cross-sectional view illustrating the stacking system according to the first embodiment of the present disclosure. In the embodiment, a stacking system 1 is provided to solve the heat dissipation problem of a vertical power supply. The stacking system 1 includes a circuit board 10, an integrated circuit 20, a voltage regulation module 30, a heat dissipation module 40 and a fastening component. The circuit board 10 includes a first side 11 and a second side 12 opposite to each other. The integrated circuit 20 is disposed on the first side 11 of the circuit board 10. The voltage regulation module 30 is disposed on the second side 12 of the circuit board 10 and spatially corresponding to the integrated circuit 20. The heat dissipation module 40 includes a first heat dissipation component 41 and a second heat dissipation component 42. In the embodiment, the first heat dissipation component 41 is disposed on at a top surface 21 of the integrated circuit 20 and in thermal contact with the integrated circuit 20. The second heat dissipation component 42 includes a base 421 and two extended arms 422, 423. The base 421 is disposed on a bottom surface 31 of the voltage regulation module 30 and in thermal contact with the bottom surface 31 of the voltage regulation module 30. In the embodiment, the two extended arms 422, 423 are extended from the base 421 along a direction (i.e., the Z axial direction) from the voltage regulation module 30 toward the circuit board 10 and in thermal contact with the first heat dissipation component 41, respectively. In the embodiment, the fastening component includes a first fastening element 50 and a second fastening element 60. Preferably but not exclusively, the first fastening element 50 is connected to the first heat dissipation component 41 and the circuit board 10, and pushes the first heat dissipation component 41 to be attached to the top surface 21 of the integrated circuit 20 and the two extended arms 422, 423 of the second heat dissipation component 42. Preferably but not exclusively, the second fastening element 60 is connected to the second heat dissipation component 42 and the circuit board 10, and pushes the base 421 of the second heat dissipation component 42 to be attached to the bottom surface 31 of the voltage regulation module 30. In that, the second heat dissipation component 42, the voltage regulation module 30, the circuit board 10, the integrated circuit 20 and the first heat dissipation component 41 of the stacking system 1 are stacked in the Z axial direction to form a stacking structure, for example, perpendicular to the first side 11 and the second side 12 of the circuit board 10. The heat generated from the integrated circuit 20 and the heat generated from the voltage regulation module 30 are dissipated through the first heat dissipation component 41 and the second heat dissipation member 42, respectively.

In the embodiment, the first heat dissipation component 41 for example is a liquid-cooling heat sink, and the liquid-cooling heat sink includes an inflow tube 412, an outflow tube 413 and a liquid-cooling chamber 414. The inflow tube 412 and the outflow tube 413 are in fluid communication with the liquid-cooling chamber 414, are disposed at one side of the first heat dissipation component 41. For example, the inflow tube 412 and the outflow tube 413 are faced toward the X axial direction. Furthermore, a cooling liquid (not shown) contained in the liquid-cooling chamber 414 is circulated through the inflow tube 412 and the outflow tube 413, so as to achieve the cooling effect. In the embodiment, the heat generated from the integrated circuit 20 is dissipated and taken away through the cooling liquid in the liquid-cooling chamber 414. Certainly, the present disclosure is not limited thereto. In the embodiment, the second heat dissipation component 42 includes two extended arms 422, 423, which are extended from two opposite sides of the base 421 along the direction from the voltage regulation module 30 toward the circuit board 10, that is, the Z axial direction. The two extended arm 422, 423 pass through the two opposite sidewalls 32, 33 of the voltage regulation module 30, the two opposite sidewalls 16, 17 of the circuit board 10 and the two opposite sidewalls 22, 23 of the integrated circuit 20, respectively, and are attached to the first heat dissipation component 41. Thus, the heat generated from the voltage regulation module 30 is transferred to the first heat dissipation component 41 through the base 421 and the two extended arms 422, 423 of the second heat dissipation component 42, and then taken away by the cooling liquid in the liquid-cooling chamber 414. It is helpful of improving the heat dissipation efficiency of the voltage regulation module 30 and enhancing the heat dissipation efficiency of the entire stack system 1. The heat dissipation path of the voltage regulation module 30 transferred through the second heat dissipation component 42 to the first heat dissipation component 41 is not influenced by the thickness of the base 421 of the second heat dissipation component 42. The thickness of the base 421 is adjusted and designed according to the height specification of the stacking system 1.

On the other hand, in the embodiment, the circuit board 10 includes at least one groove 15 recessed inwardly from an outer periphery of the circuit board 10 and spatially corresponding to at least one of the two extended arms 422, 423 of the second heat dissipation component 42. In the embodiment, two grooves 15 are recessed inwardly from two opposite sidewalls of the circuit board 10. The two extended arms 422, 423 are extended from the base 421 and in thermal contact with the first heat dissipation component 41 directly through the two grooves 15, so as to avoid elongating the heat dissipation path of the voltage regulation module 30 to the first heat dissipation component 41 transferred through the second heat dissipation component 42. In other words, with the arrangement of the two grooves 15, the two opposite sidewalls 32, 33 of the voltage regulation module 30, the two opposite sidewalls 16, 17 of the circuit board 10 and the two opposite sidewalls 22, 23 of the integrated circuit 20 are coplanar, respectively. In that, the two extended arms 422, 423 of the second heat dissipation component 42 are fit with the two opposite sidewalls 32, 33 of the voltage regulation module 30, the two opposite sidewalls 16, 17 of the circuit board 10 and the two opposite sidewalls 22, 23 of the integrated circuit 20, and connected to the first heat dissipation component 41, respectively. In the embodiment, a U-shaped structure is collaboratively formed by the base 421 and the two extended arms 422, 423 of the second heat dissipation component 42, so that the heat dissipation path of the voltage regulation module 30 is optimized. In other embodiments, the groove 15 for example is a through groove, which directly penetrates the first side 11 and the second side 12 of the circuit board 10. Certainly, the present disclosure is not limited thereto, and redundantly described hereafter.

Notably, in the embodiment, the first fastening element 50 and the second fastening element 60 are spring screws. In order to fasten the first heat dissipation component 41 and the second heat dissipation component 42 to the circuit board, the fastening component includes at least two first fastening elements 50 and at least two second fastening elements 60. The at least two first fastening elements 50 are located at two opposite sides of the integrated circuit 20. The at least two second fastening elements 60 are located at two opposite sides of the voltage regulation module 30. In the embodiment, the fastening component includes four first fastening elements 50 and four second fastening elements 60 for illustrating. In other embodiments, the numbers and the arrangements of the first fastening element 50 and the second fastening element 60 are adjustable according to practical requirement. The present disclosure is not limited thereto.

In the embodiment, the first fastening element 50 includes a screw rod 51, a nut 53 and a compression spring 52, and the compression spring 52 is sleeved on the screw rod 51. The second fastening element 60 includes a screw rod 61, a nut 63 and a compression spring 62, and the compression spring 62 is sleeved on the screw rod 61. Corresponding to the first fastening element 50, the circuit board 10 includes a first fastening hole 13 passed through the first side 11 and the second side 12. In addition, the first heat dissipation component 41 includes a first through hole 411 spatially corresponding to the first fastening hole 13. In the embodiment, the first fastening element 50 is connected to the circuit board 10 and the first heat dissipation component 41 by passing through the first fastening hole 13 and the first through hole 411. The circuit board 10 and the first heat dissipation component 41 are limited in position between the screw rod 51 and the nut 53 of the first fastening element 50, and an elastic force is provided by the compression spring 52 between the screw rod 51 and the circuit board 10, so that the first heat dissipation component 41 is pushed and attached to the top surface 21 of the integrated circuit 20. Moreover, in the embodiment, corresponding to the second fastening element 60, the circuit board 10 includes a second fastening hole 14 passed through the first side 11 and the second side 12. The second heat dissipation component 42 includes a second through hole 424 spatially corresponding to the second fastening hole 14. In the embodiment, the second fastening element 60 is connected to the circuit board 10 and the second heat dissipation component 42 by passing through the second fastening hole 14 and the second through hole 424. The circuit board 10 and the second heat dissipation component 42 are limited in position between the screw rod 61 and the nut 63 of the second fastening element 60, and an elastic force is provided by the compression spring 62 between the screw rod 61 and the circuit board 10, so that the base 421 of the second heat dissipation component 42 is pushed and attached to the bottom surface 31 of the voltage regulation module 30, and the two extended arms 422, 423 of the second heat dissipation component 42 is pushed and attached to the first heat dissipation component 41 at the same time. Notably, the fastening and connecting method between the circuit board 10 and the heat dissipation module is for example but not limited to the fastening and connecting of the first fastening element 50 and the second fastening element 60. Moreover, the fastening operation sequence and the fastening direction are adjustable according to the practical requirements. The present disclosure is not limited thereto.

In the embodiment, the first fastening element 50 and the second fastening element 60 of the fastening component are illustrated by taking spring screws as an example, but the present disclosure is not limited thereto. In the embodiment, the stacking system 1 further includes a first thermal interface material layer 71 disposed between the top surface 21 of the integrated circuit 20 and the first heat dissipation component 41, a second thermal interface material layer 72 disposed between the bottom surface 31 of the voltage regulation module 30 and the base 421 of the second heat dissipation component 42, and a third thermal interface material layer 73 disposed between the first heat dissipation component 41 and the two extended arms 422, 423 of the second heat dissipation component 42, so as to reduce the influence of the interface thermal resistance between components. Thus, with the arrangements of the first thermal interface material layer 71, the second thermal interface material layer 72 and the third thermal interface material layer 73, the thermal resistance of the heat dissipation path is reduced and the influence of dimensional tolerance is improved at the same time. In addition, since the thermal interface material layer is made of thermally conductive silica gel or resin, and the polymer has a certain flexibility, a certain buffering effect is provided when the heat dissipation module 40 and the circuit board 10 of the stacking system 1 are pressed together in a fixed connection. Certainly, the present disclosure is not limited thereto.

Figure 5:
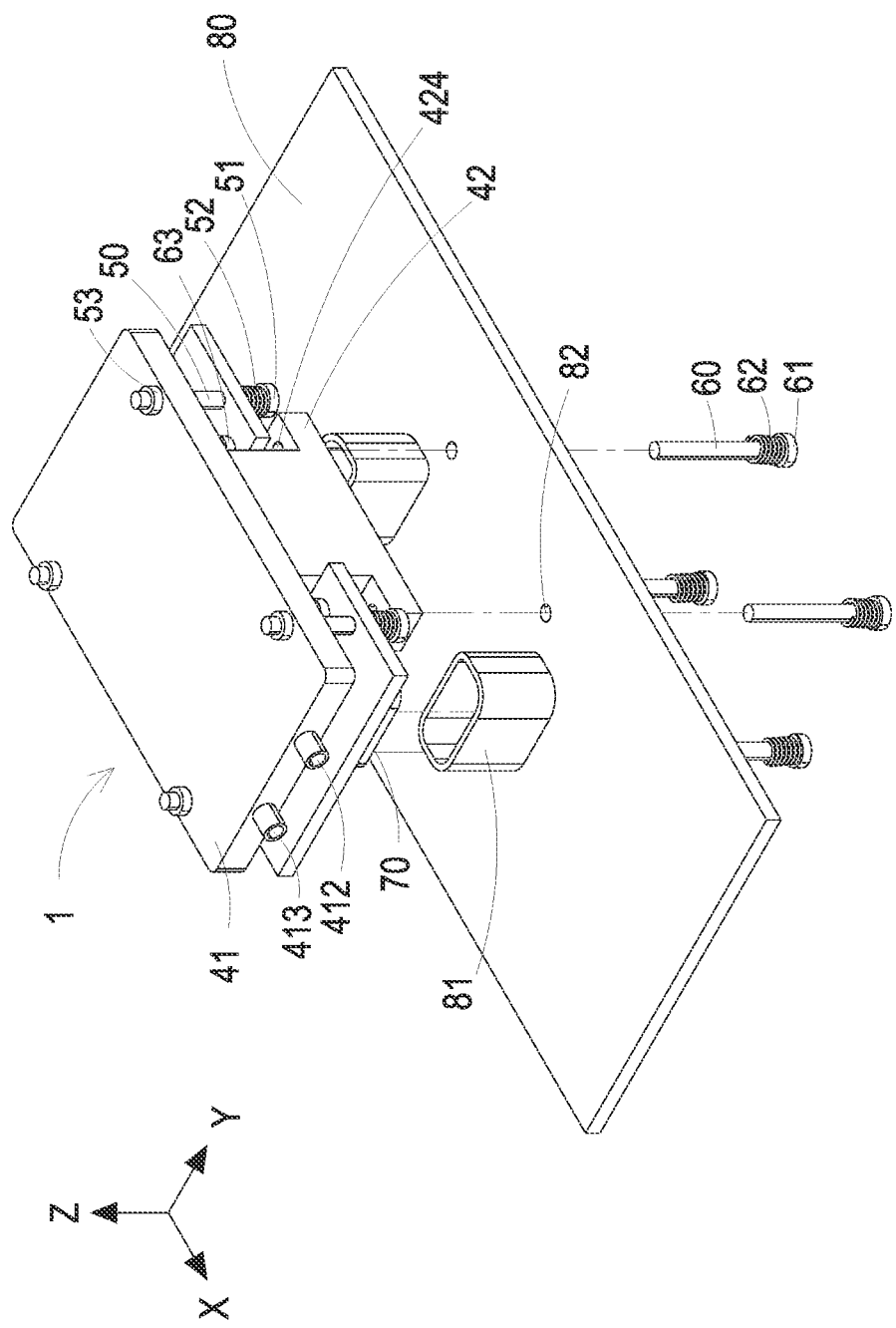
FIG. 5 is an exploded view illustrating the stacking system connected to a system motherboard according to the first embodiment of the present disclosure.
Figure 6:
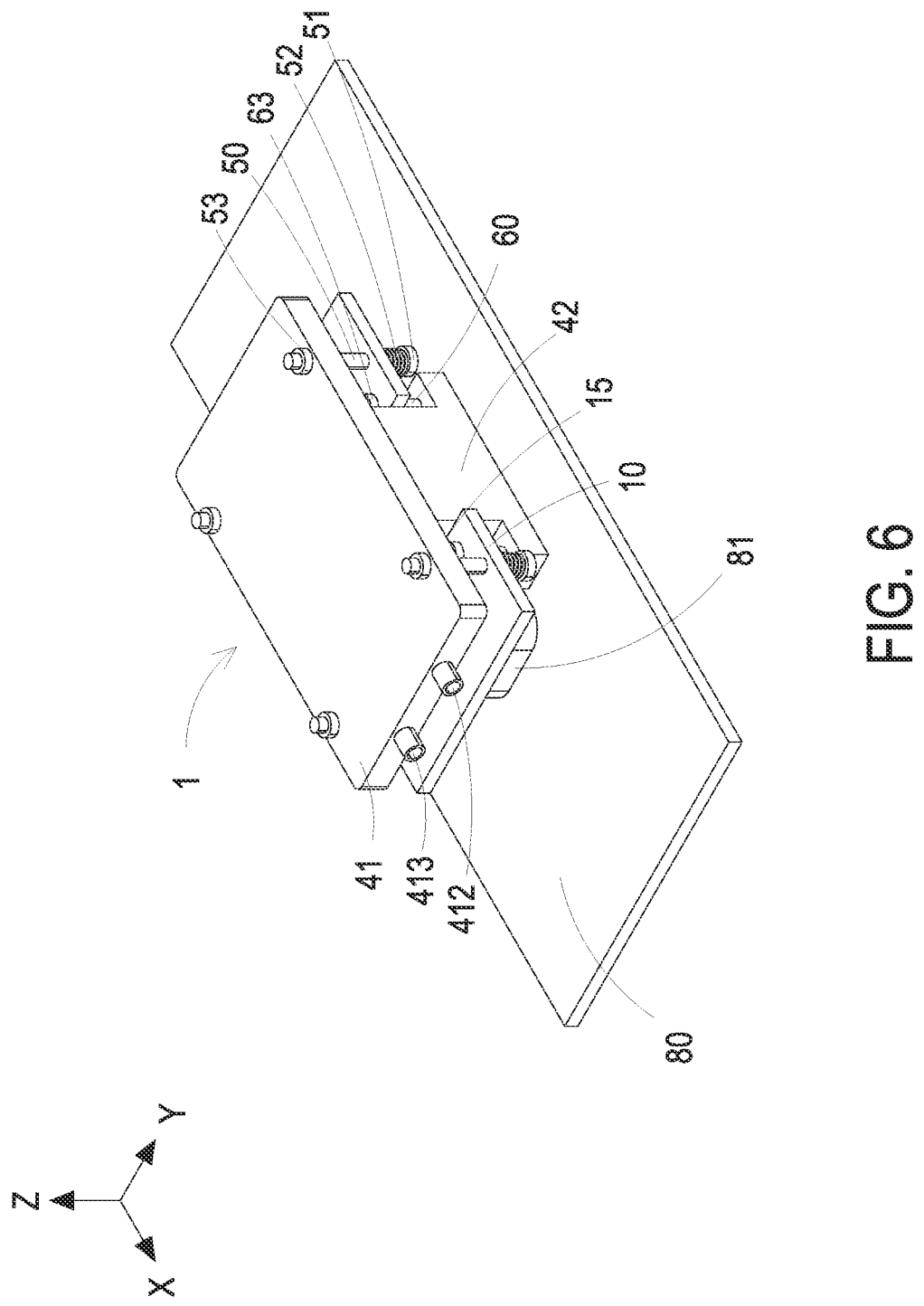
FIG. 6 is a schematic structural view illustrating the stacking system connected to the system motherboard according to the first embodiment of the present disclosure.
Figure 7:
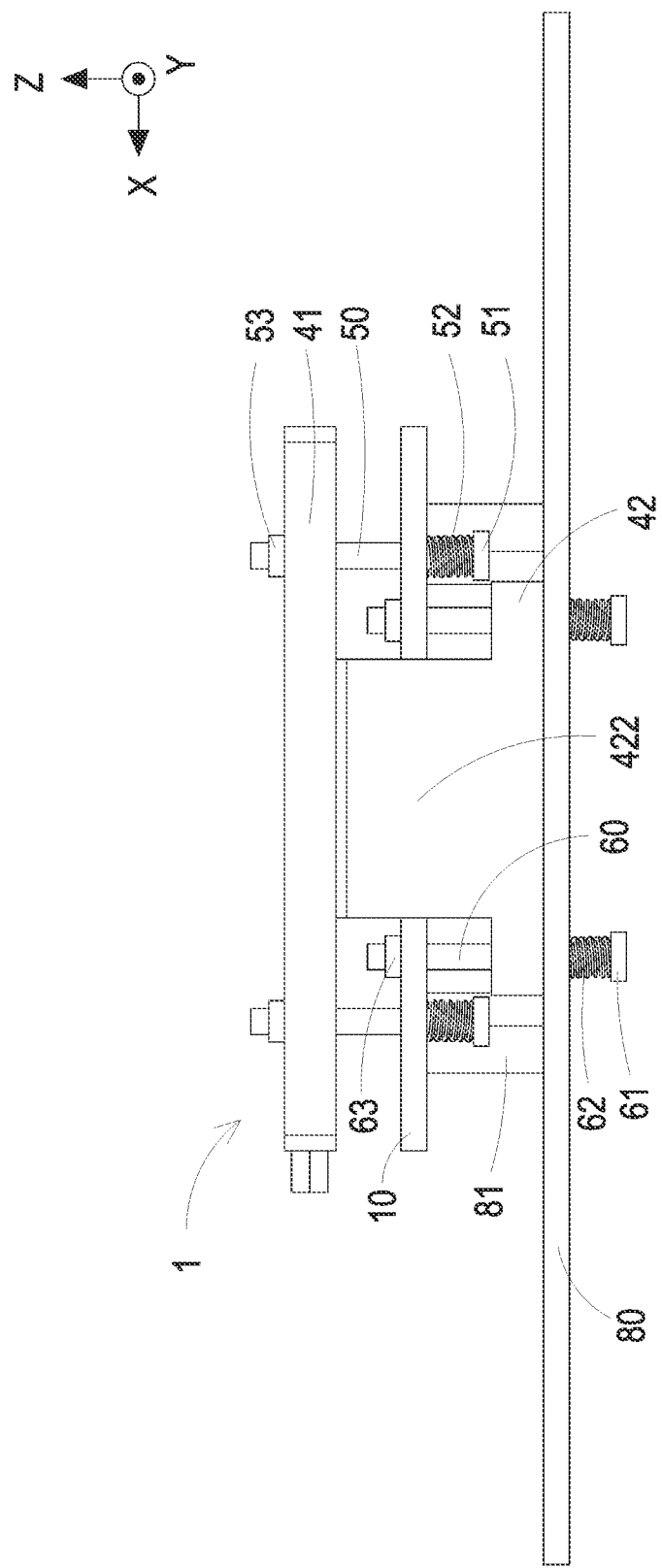
FIG. 7 is a lateral view of FIG. 6.

In the embodiment, the integrated circuit 20 for example is a graphics processing unit (GPU) chip, a central processing unit (CPU) chip, an application specific integrated circuit (ASIC) chip or a field programmable gate array (FPGA) chip. In the embodiment, the stacking system 1 including the integrated circuit 20 and the voltage regulation module 30 is further configured to connect and assembly with a system motherboard. FIG. 5 is an exploded view illustrating the stacking system connected to a system motherboard according to the first embodiment of the present disclosure. FIG. 6 is a schematic structural view illustrating the stacking system connected to the system motherboard according to the first embodiment of the present disclosure. FIG. 7 is a lateral view of FIG. 6. Please refer to FIG. 1 to FIG. 7. In the embodiment, the stacking system 1 further includes at least one plug-in portion 70 disposed on the second side 12 of the circuit board 10. The at least one plug-in portion 70 of the stacking system 1 is correspondingly connected to the at least one socket 81 of a system motherboard 80, so that the integrated circuit 20 and the voltage regulation module 30 are electrically connected to the system motherboard 80. In the embodiment, two plug-in portions 70 are disposed correspondingly on the second side 12 of the circuit board 10, and the voltage regulation module 30 is disposed between the two plug-in portions 70. Through the two plug-in portions 70 connected to the system motherboard 80, the power supply requirement and the signal connection for the integrated circuit 20 are realized, so that the power supply is inputted vertically, and the signal transmission between the integrated circuit 20 and the system motherboard 80 is achieved.

In the embodiment, when the stacking system 1 is assembled to the system motherboard 80, the vertical height (in the Z axial direction) between the stacking system 1 and the system motherboard 80 is limited by the height of the socket 81. Moreover, the voltage regulation module 30 is disposed between the two plug-in portions 70, so the voltage regulation module 30 is located between the two sockets 81 after the stacking system 1 is assembled to the system motherboard 80. Due to the height limitation of the socket 81, the vertical height of the base 421 of the second heat sink 42 is designed according to the height difference between the socket 81 and the voltage regulation module 30, so as to solve the heat dissipation problem in the limited space. In other words, the stacking system 1 stacked vertically facilitates to solve the heat dissipation problem of the integrated circuit 20 and the voltage regulation module 30 in the vertical power supply. In the embodiment, the system motherboard 80 includes a mounting hole 82 spatially opposite to the second through hole 424 of the second heat sink 42. When the stacking system 1 is connected and assembled with the two sockets 81 of the system motherboard 80 through the two plug-in portions 70 disposed on the second side 12 of the circuit board 10, the second fastening element 60 is connected to the system motherboard 80, the second heat dissipation component 42 and the circuit board 10 through the mounting hole 82 of the system motherboard 80, the second through hole 424 of the second heat dissipation component 42 and the second fastening hole 14 of the circuit board 10, respectively. In the embodiment, the space between the stacking system 1 and the system motherboard 80 is limited. However, the second fastening element 60 for fastening the second heat dissipation component 42 is further used to fasten the stacking system 1 to the system motherboard 80, so as to simplify the assembling process of the heat dissipation module, reduce the cost of the heat dissipation module, and improve the competitiveness of the product. In other embodiments, when the space between the stacking system 1 and the system motherboard 80 is sufficient, the second fastening element 60 is connect the second heat dissipation component 42 and the circuit board 10 merely. Certainly, the present disclosure is not limited thereto.

Figure 8:
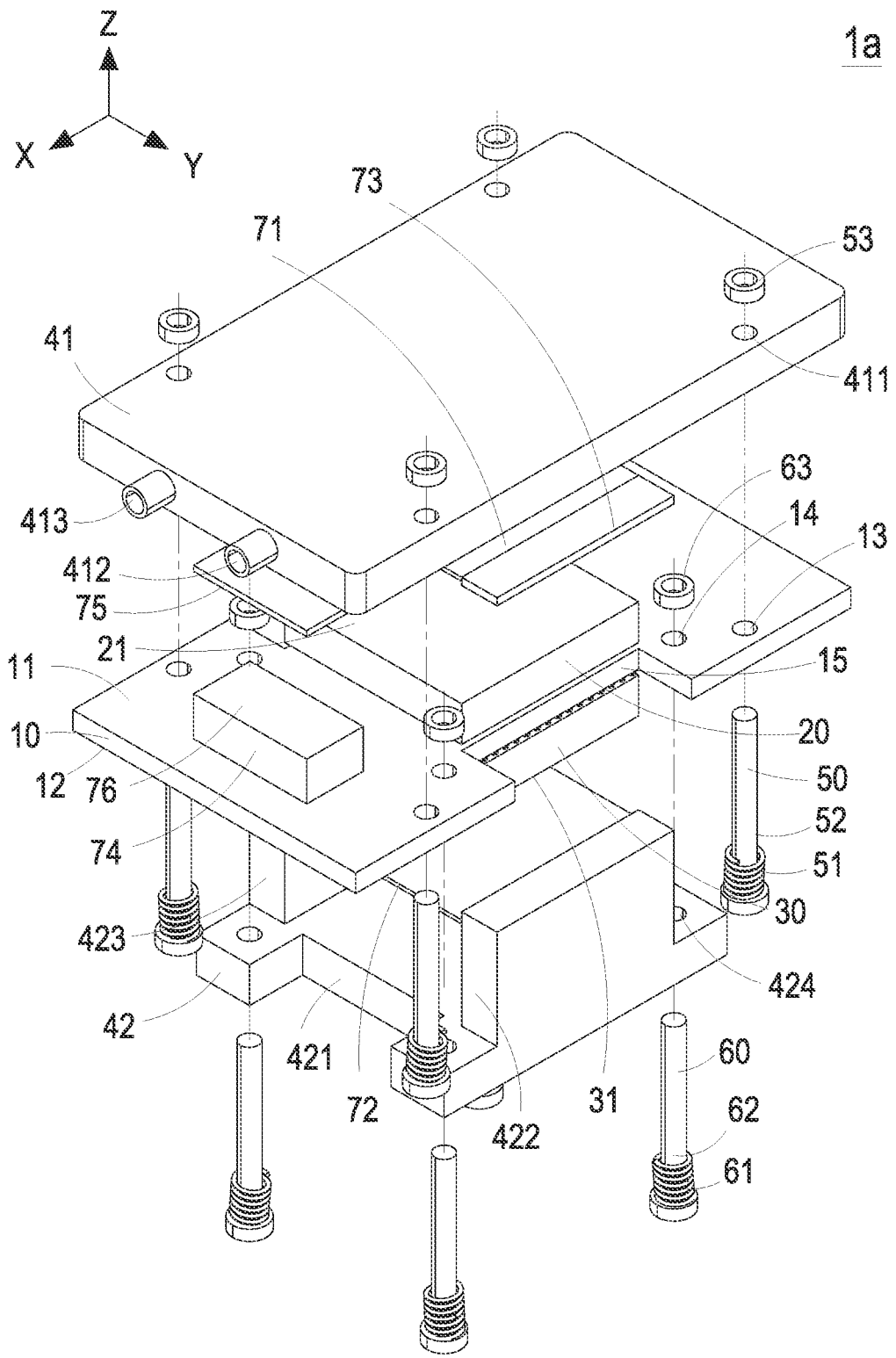
FIG. 8 is an exploded view illustrating a stacking system according to a second embodiment of the present disclosure.
Figure 9:
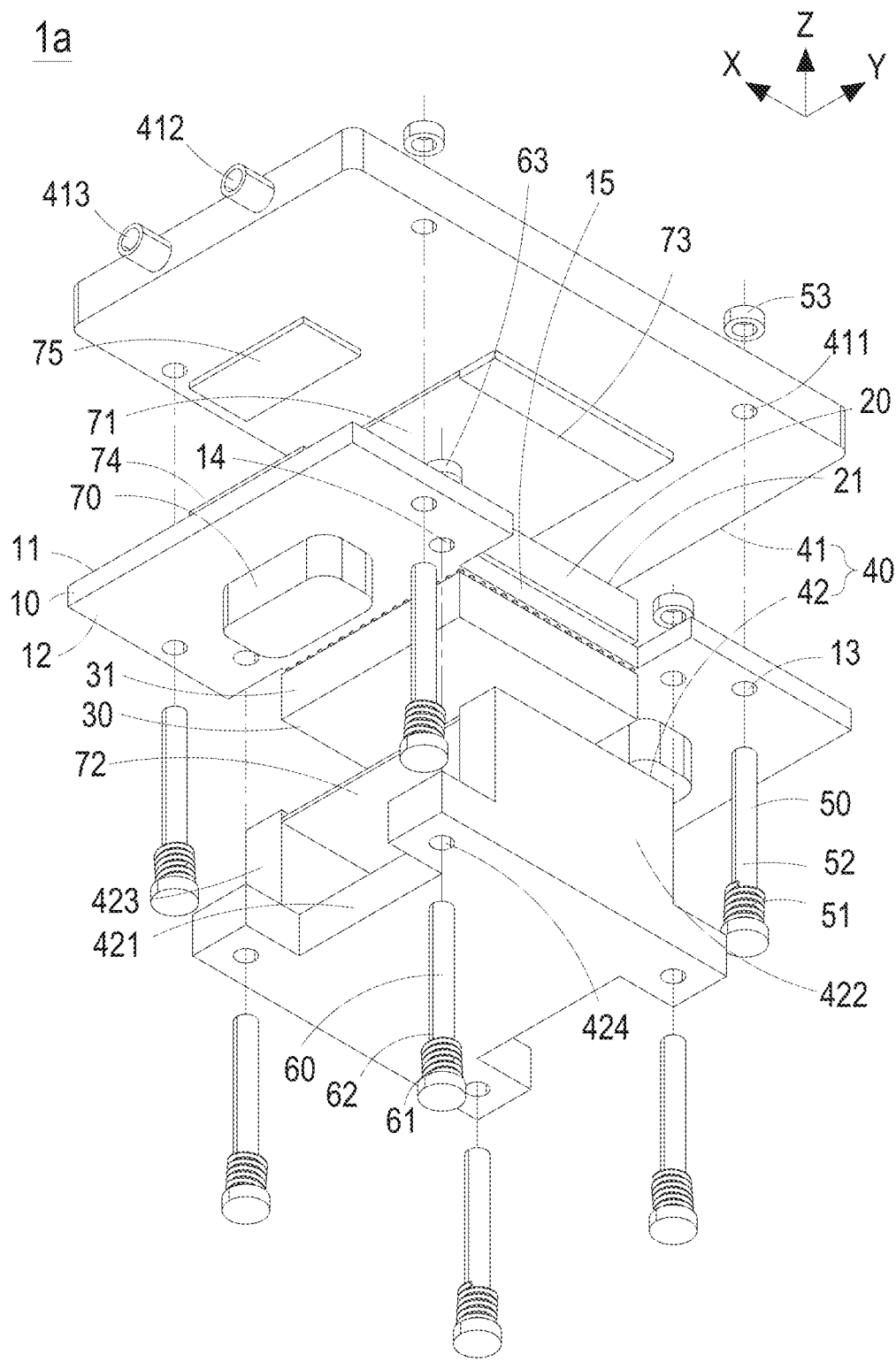
FIG. 9 is an exploded view illustrating the stacking system according to the second embodiment of the present disclosure and taken from another perspective.
Figure 10:
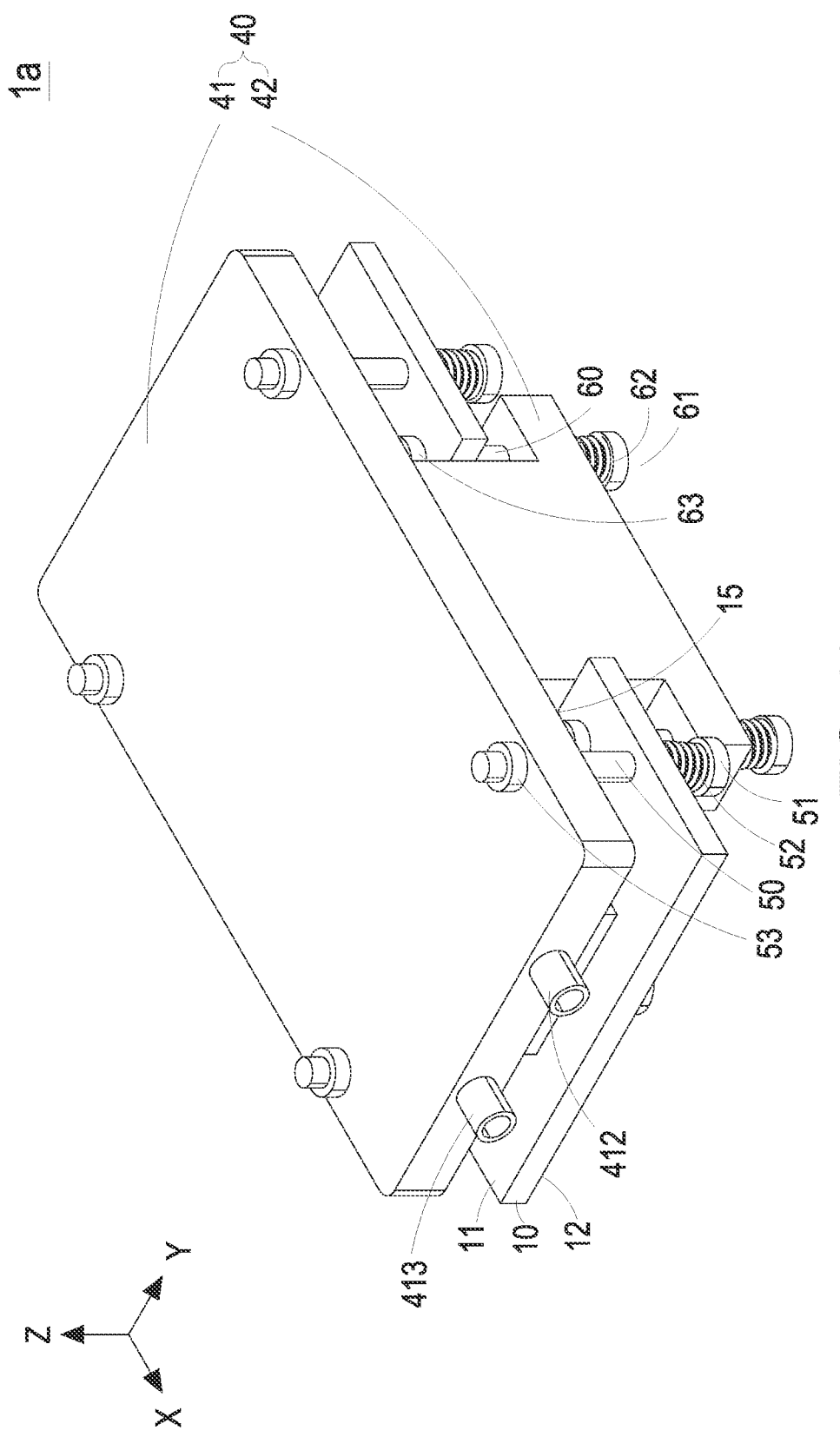
FIG. 10 is a schematic structural view illustrating the stacking system according to the second embodiment of the present disclosure.
Figure 11:
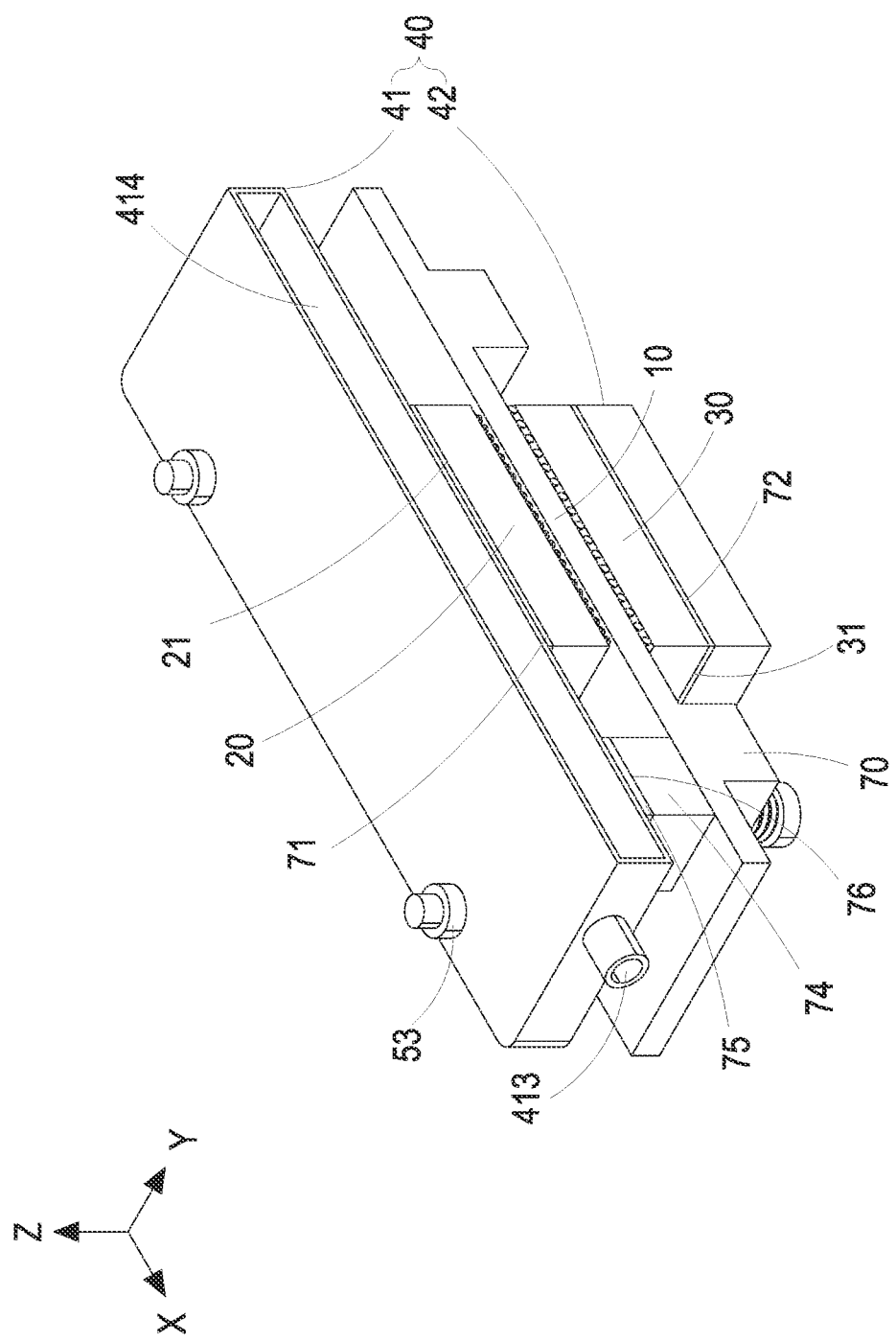
FIG. 11 is a schematic cross-sectional view illustrating the stacking system according to the second embodiment of the present disclosure.

FIG. 8 and FIG. 9 are exploded views illustrating a stacking system according to a second embodiment of the present disclosure. FIG. 10 is a schematic structural view illustrating the stacking system according to the second embodiment of the present disclosure. FIG. 11 is a schematic cross-sectional view illustrating the stacking system according to the second embodiment of the present disclosure. In the embodiment, the structures, elements and functions of the stacking system 1a are similar to those of the stacking system 1 of FIG. 1 to FIG. 7, and are not redundantly described herein. In the embodiment, the stacking system 1a further includes a bus converter 74 disposed on the first side 11 of the circuit board 10 and electrically connected between the plug-in portion 70 and the voltage regulation module 30. With the configuration of the bus converter 74, the power supply voltage provided by the plug-in portion 70 is converted from a high voltage to 6V or 12V and supplied to the voltage regulation module 30. It has an advantage that the power supply of the plug-in portion 70 is allowed to increase from a low voltage of 6V or 12V to a high voltage of 48V or 54V, so the current carried by the plug-in portion 70 is greatly reduced, the loss of the plug-in portion 70 is greatly reduced, the number of power supply pins in the plug-in portion 70 is greatly reduced, and the size of the plug-in portion 70 is reduced. As the size of the plug-in portion 70 disposed on the second side 12 of the circuit board 10 is reduced, the vertical height of the voltage regulation module 30 disposed on the second side 12 of the circuit board 10 and the vertical height of the base 421 of the second heat dissipation component 42 is reduced. It facilitates the stacking system 1a to be coupled to the system motherboard 80 in the manner of the aforementioned embodiments. Certainly, the present disclosure is not limited thereto.

In the embodiment, the heat dissipation of the bus converter 74 is achieved by attaching the first heat dissipation component 41 to the bus converter 74. Since the bus converter 74 is disposed on the first side 11 of the circuit board 10, when the first fastening element 50 is connected to the circuit board 10 and the first heat dissipation component 41, the first fastening element 50 pushes the first heat dissipation component 41 to be attached to the top surface 76 of the bus converter 74 at the same time. In the embodiment, the stacking system 1a further includes a thermal interface material layer 75 disposed between the top surface 76 of the bus converter 74 and the first heat dissipation component 41 to enhance the heat dissipation performance and improve the influence of dimensional tolerance. Certainly, the present disclosure is not limited thereto.

Figure 12:
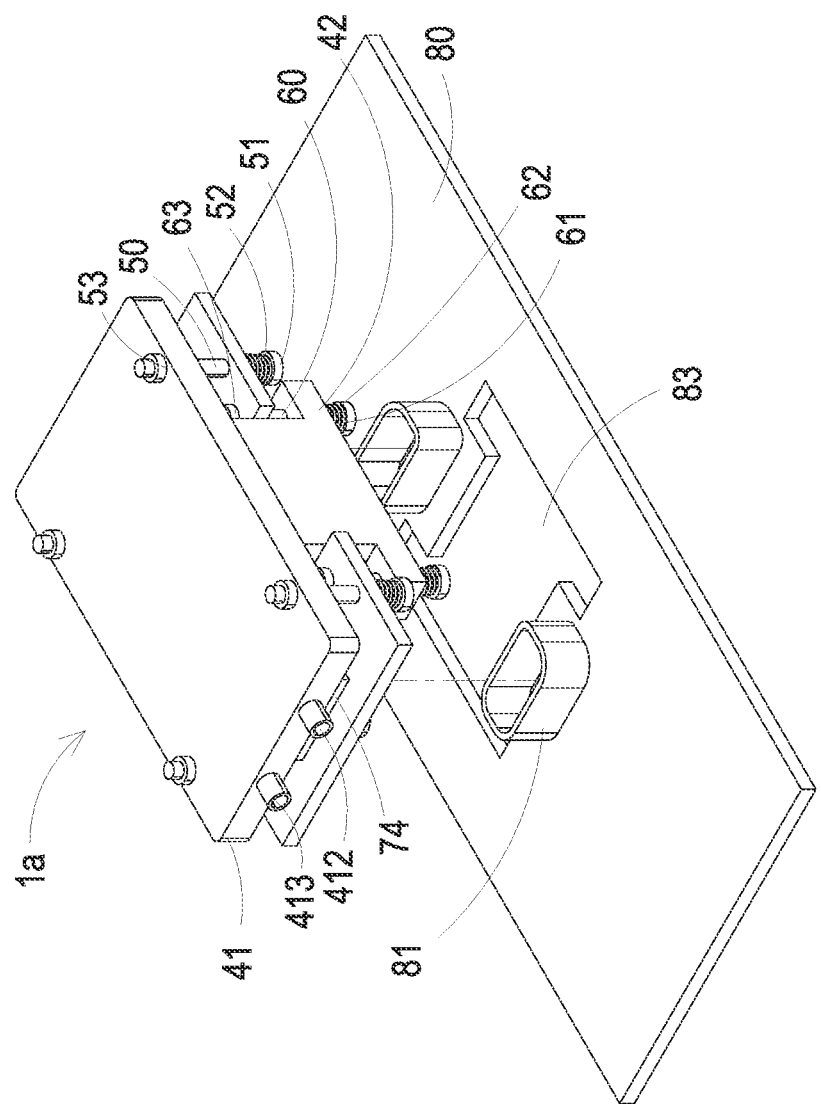
FIG. 12 is an exploded view illustrating the stacking system connected to a system motherboard according to the second embodiment of the present disclosure.
Figure 13:
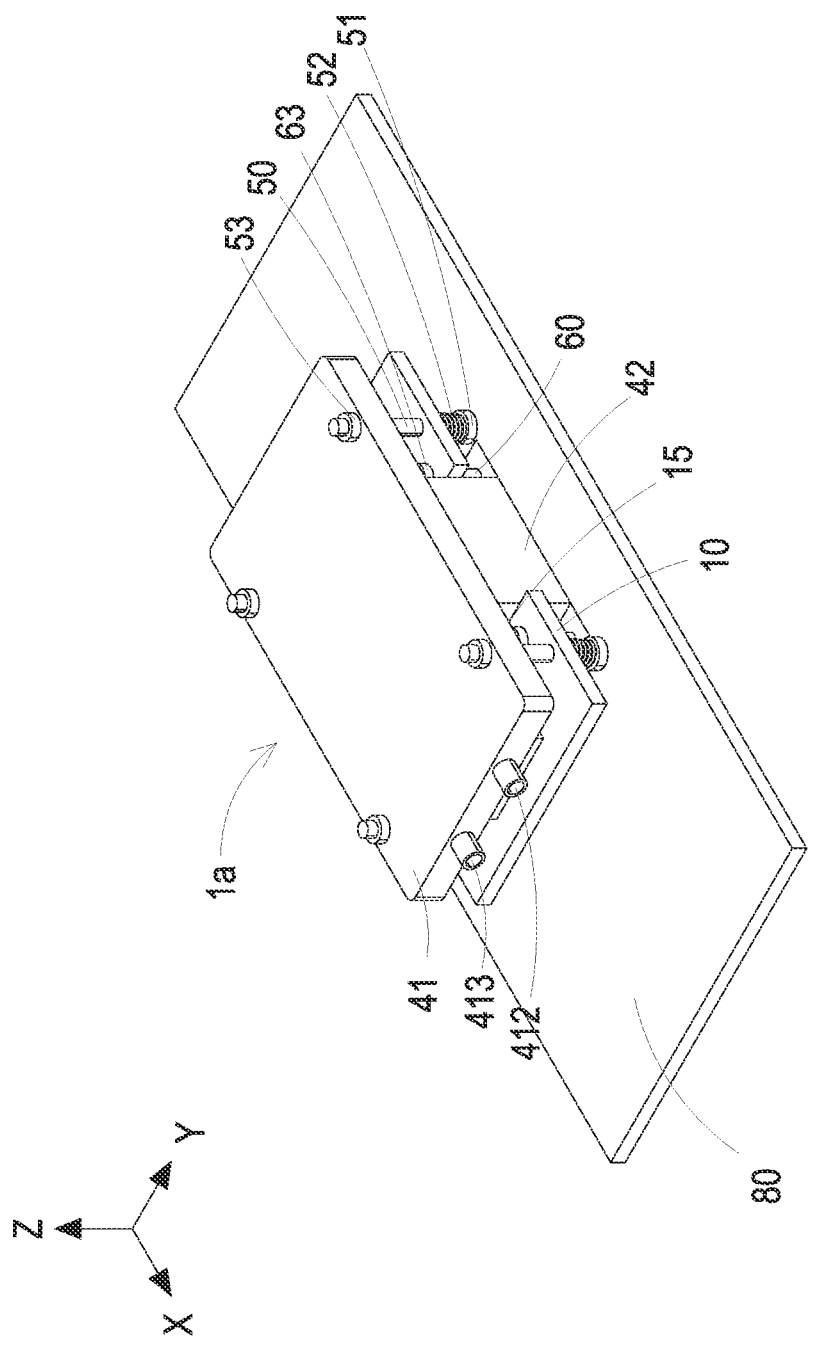
FIG. 13 is a schematic structural view illustrating the stacking system connected to the system motherboard according to the second embodiment of the present disclosure.
Figure 14:
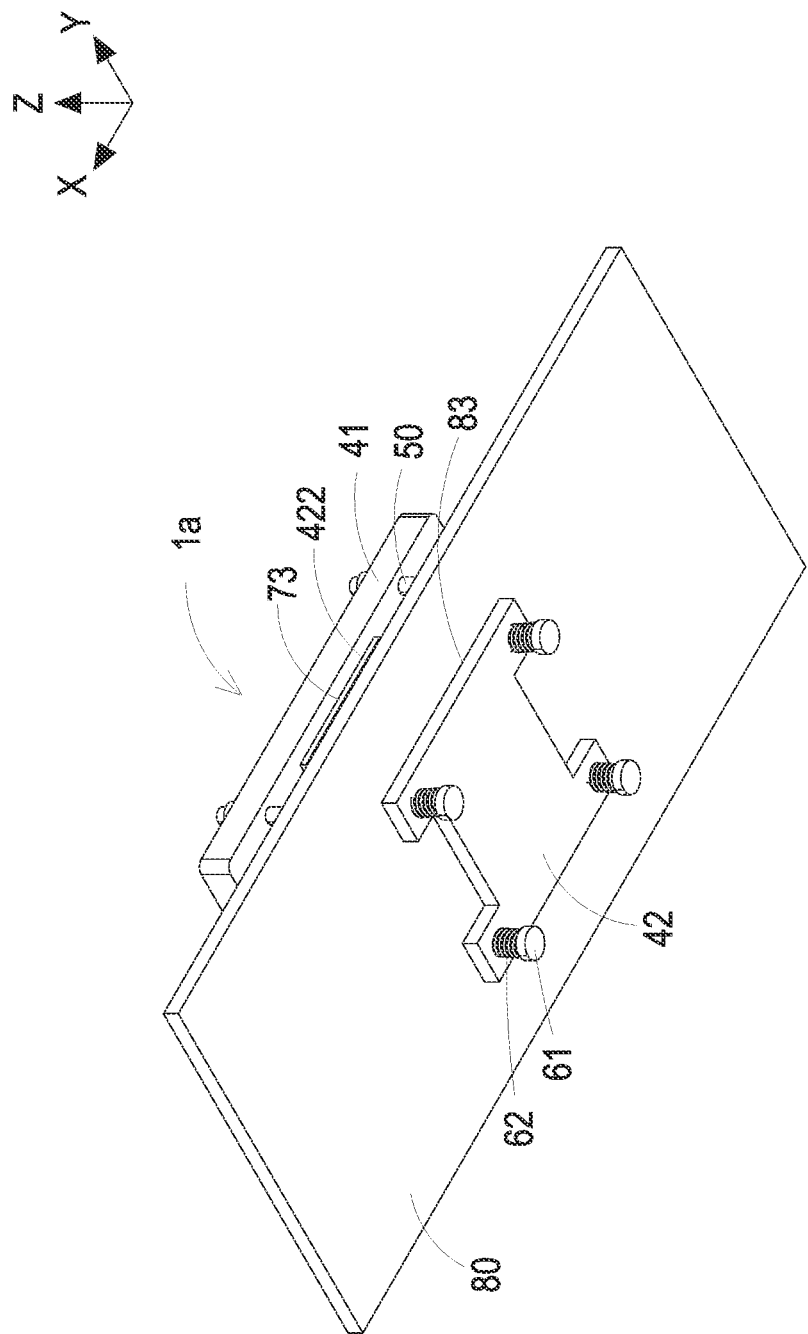
FIG. 14 is a schematic structural view illustrating the stacking system connected to the system motherboard according to the second embodiment of the present disclosure and taken from another perspective.
Figure 15:
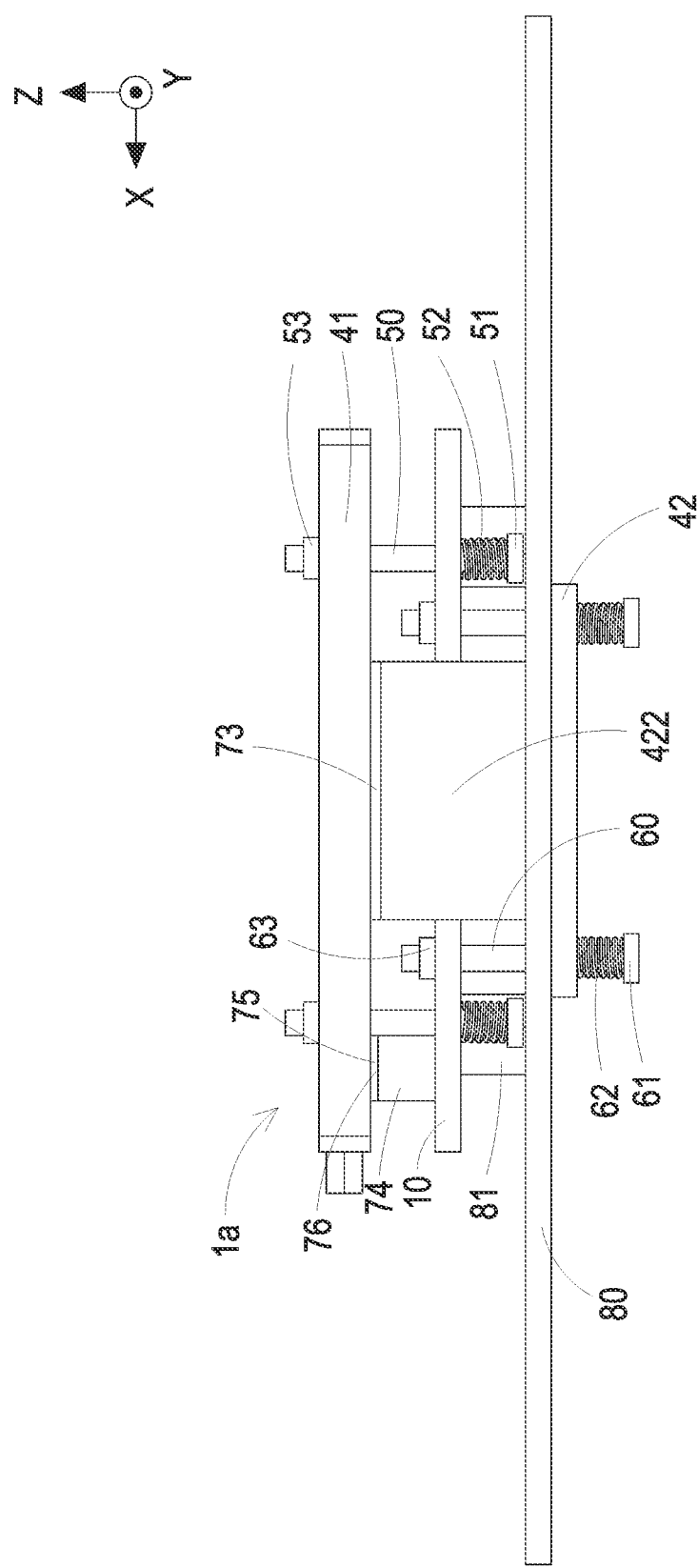
FIG. 15 is a lateral view of FIG. 13.

FIG. 12 is an exploded view illustrating the stacking system connected to a system motherboard according to the second embodiment of the present disclosure. FIG. 13 is a schematic structural view illustrating the stacking system connected to the system motherboard according to the second embodiment of the present disclosure. FIG. 14 is a schematic structural view illustrating the stacking system connected to the system motherboard according to the second embodiment of the present disclosure and taken from another perspective. FIG. 15 is a lateral view of FIG. 13. Please refer to FIG. 8 to FIG. 15. In the embodiment, through the application of the voltage regulation module 30 combined with the bus converter 74, the sizes of the plug-in portion 70 and the socket 81 can be further reduced. In other words, the combination distance between the stacking system 1a and the system motherboard 80 is reduced. On the other hand, in order to avoid the interference between the heat dissipation module 40 and the system motherboard 80 in the vertical direction (i.e., the Z axial direction), in the embodiment, the system motherboard 80 includes an accommodation opening 83 spatially corresponding to the second heat dissipation component 42. When the plug-in portion 70 of the stacking system 1a is connected correspondingly to the socket 81 of the system motherboard 80, the second heat dissipation component 42 is at least partially accommodated in the accommodation opening 83 or passes through the system motherboard 80 through the accommodation opening 83. For example, a shape of the accommodation opening 83 is matched with a shape of the base 421 of the second heat dissipation component 42, and the base 421 is partially exposed to a bottom surface of the system motherboard 80. Certainly, the present disclosure is not limited thereto. In other embodiments, as the combination distance between the stacking system 1a and the system motherboard 80 is reduced, it allows the stacking system 1a to reduce the height of the base 421 of the second heat dissipation component 42 in the vertical direction. In that, the sum of the height of the base 421 of the second heat dissipation component 42 and the height of the voltage regulation module 30 in the vertical direction are smaller than that of the plug-in portion 71, and it allows omitting the accommodation opening 83 of the system motherboard 80. That is, a bottom surface of the base 421 of the second heat dissipation 42 is located on the top surface of the system motherboard 80. Consequently, the firmness of the system motherboard 80 and the overall reliability of the system are increased. Certainly, the assembling method of the stacking system 1a and the system motherboard 80 is adjustable according to the practical requirements. The present disclosure is not limited thereto and not redundantly described herein.

In summary, the present disclosure provides a stacking system including a heat dissipation structure matched with a vertical power supply for improving the heat dissipation efficiency of a voltage regulation module in the stacking system with a limited space, simplifying the assembling and manufacturing process and reducing the cost at the same time. In the stacking system for a vertical power supply, the voltage regulation module and the integrated circuit are arranged on two opposite sides of the circuit board through two fastening element, respectively. The heat dissipation module includes two heat dissipation components, which are in thermal contact with the top surface of the integrated circuit and the bottom surface of the voltage regulation module respectively, so as to form a vertical stacking structure. On the other hand, the two heat dissipation components are in contact with each other through an extension arm extended from one of the heat dissipation components, so as to improve the heat dissipation efficiency of the stacked system. Furthermore, the two heat dissipation components of the heat dissipation module are fastened and connected to the circuit board by fastening components such as spring screws, respectively. When the combination structure that is vertically stacked is formed, the two heat dissipation components are connected and effectively attached to the top surface of the integrated circuit and the bottom surface of the voltage regulation module, respectively. Moreover, a thermal interface material layer is provided between the heat dissipation module and the integrated circuit, and between the heat dissipation module and the voltage regulation module, so as to further enhance the heat dissipation performance. Since the stacking system is correspondingly connected to a system motherboard through a plug-in portion thereof, the space between the voltage regulation module and the system motherboard is limited. With the combination structure stacked vertically, the heat dissipation problem of the heat dissipation module is solved effectively. The fastening component configured to fix the heat dissipation module is allowed to fix the stacking system on the system motherboard at the same time, so as to simplify the assembling process of the heat dissipation module, reduce the cost of the heat dissipation module, and improve the competitiveness of the product. In addition, in the application of the voltage regulation module combined with the bus voltage converter, the combination distance between the stacking system and the system motherboard is reduced, the vertical stacking structure of the stacking system can avoid the interference between the heat dissipation module and the system motherboard in the vertical direction through an accommodation opening of the system motherboard, and the overall height of the stacking system and the system motherboard is further reduced after assembly. The heat dissipation problem caused in the limited space is solved effectively.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stacking system, comprising:
a circuit board comprising a first side and a second side opposite to each other;
an integrated circuit disposed on the first side of the circuit board;
a voltage regulation module disposed on the second side of the circuit board and spatially corresponding to the integrated circuit; and
a heat dissipation module comprising a first heat dissipation component and a second heat dissipation component, wherein the first heat dissipation component is located at a top surface of the integrated circuit and in thermal contact with the top surface of the integrated circuit, the second heat dissipation component comprises a base and at least one extended arm, the base is located at a bottom surface of the voltage regulation module and in thermal contact with the bottom surface of the voltage regulation module, and the at least one extended arm is extended from the base along a direction from the voltage regulation module toward the circuit board and in thermal contact with the first heat dissipation component.

2. The stacking system according to claim 1, further comprising a fastening component including a first fastening element and a second fastening element, wherein the first fastening element is connected to the first heat dissipation component and the circuit board, and pushes the first heat dissipation component to be attached to the top surface of the integrated circuit and the at least one extended arm of the second heat dissipation component, wherein the second fastening element is connected to the second heat dissipation component and the circuit board, and pushes the base of the second heat dissipation component to be attached to the bottom surface of the voltage regulation module.

3. The stacking system according to claim 2, wherein the circuit board comprises a first fastening hole passed through the first side and the second side, and the first heat dissipation component comprises a first through hole spatially corresponding to the first fastening hole, wherein the first fastening element is connected to the circuit board and the first heat dissipation component by passing through the first fastening hole and the first through hole, respectively.

4. The stacking system according to claim 2, wherein the circuit board comprises a second fastening hole passed through the first side and the second side, and the second heat dissipation component comprises a second through hole spatially corresponding to the second fastening hole, wherein the second fastening element is connected to the circuit board and the second heat dissipation component by passing through the second fastening hole and the second through hole, respectively.

5. The stacking system according to claim 1, further comprising at least one plug-in portion disposed on the second side of the circuit board, wherein the at least one plug-in portion of the stacking system is correspondingly connected to at least one socket of a system motherboard, so that the integrated circuit and the voltage regulation module are electrically connected to the system motherboard.

6. The stacking system according to claim 5, wherein the at least one plug-in portion includes two plug-in portions, and the voltage regulation module is disposed between the two plug-in portions.

7. The stacking system according to claim 4, further comprising at least one plug-in portion disposed on the second side of the circuit board, wherein the at least one plug-in portion of the stacking system is correspondingly connected to at least one socket of a system motherboard, so that the integrated circuit and the voltage regulation module are electrically connected to the system motherboard, and the system motherboard comprises a mounting hole spatially corresponding to the second through hole of the second heat dissipation component, wherein when the at least one plug-in portion of the stacking system is correspondingly connected to the at least one socket of the system motherboard, the second fastening element is connected to the system motherboard, the second heat dissipation component and the circuit board by passing through the mounting hole, the second fastening hole and the second through hole, respectively.

8. The stacking system according to claim 7, wherein a bottom surface of the base of the second heat dissipation component is attached to a top surface of the system board.

9. The stacking system according to claim 7, wherein the system motherboard comprises an accommodation opening spatially corresponding to the second heat dissipation component, wherein when the at least one plug-in portion of the stacking system is connected to the at least one socket of the system motherboard, the second heat dissipation component is at least partially accommodated in the accommodation opening.

10. The stacking system according to claim 9, wherein a shape of the accommodation opening is matched with a shape of the base of the second heat dissipation component, and the base is at least partially exposed to a bottom surface of the system motherboard.

11. The stacking system according to claim 7, further comprising a bus converter and a thermal interface material layer, wherein the bus converter is electrically connected between the plug-in portion and the voltage regulation module, the bus converter is disposed on the first side of the circuit board, a top surface of the bus converter is in thermal contact with the first heat dissipation component and the thermal interface material layer is disposed between the bus converter and the first heat dissipation component.

12. The stacking system according to claim 1, wherein the circuit board comprises a groove recessed inwardly from an outer periphery and spatially corresponding to the at least one extended arm of the second heat dissipation component, wherein the at least one extended arm is in thermal contact with the first heat dissipation component through the groove, a sidewall of the groove, a sidewall of the voltage regulation module and a sidewall of the integrated circuit are coplanar, and the at least one extended arm is attached to the sidewall of the groove, the sidewall of the voltage regulation module and the sidewall of the integrated circuit.

13. The stacking system according to claim 1, wherein the second heat dissipation component comprises two extended arms extended from two opposite sides of the base along the direction from the voltage regulation module toward the circuit board, passing through the two opposite sidewalls of the voltage regulation module, the circuit board and two opposite sidewalls of the integrated circuit, and in thermal contact with the first heat dissipation component, respectively, wherein a U-shaped structure is collaboratively formed by the base of the second heat dissipation component and the two extended arms.

14. The stacking system according to claim 2, wherein the first fastening element and the second fastening element are spring screws, the spring screw comprises a screw rod, a nut and a compression spring, and the compression spring is sleeved on the screw rod.

15. The stacking system according to claim 2, wherein the fastening component comprises at least two first fastening elements and at least two second fastening elements, the at least two first fastening elements are located at two opposite sides of the integrated circuit, respectively, and the at least two second fastening elements are located at two opposite sides of the voltage regulation module.

16. The stacking system according to claim 1, further comprising a thermal interface material layer disposed between the top surface of the integrated circuit and the first heat dissipation component and between the bottom surface of the voltage regulation module and the base of the second heat dissipation component.

17. The stacking system according to claim 1, further comprising a thermal interface material layer disposed between the first heat dissipation component and the at least one extended arm of the second heat dissipation component.

18. The stacking system according to claim 1, wherein the first heat dissipation component is a liquid-cooling heat sink.

19. The stacking system according to claim 18, wherein the first heat dissipation comprises an inflow tube, an outflow tube and a liquid-cooling chamber, and the inflow tube and the outflow tube are in fluid communication with the liquid-cooling chamber and are disposed at one side of the first heat dissipation component.

20. The stacking system according to claim 1, wherein the integrated circuit is a graphics processing unit chip, a central processing unit chip, an application specific integrated circuit chip or a field programmable gate array chip.

* * * * *